(12) United States Patent
Li et al.

(10) Patent No.: US 7,898,809 B2
(45) Date of Patent: Mar. 1, 2011

(54) HEAT SINK AND METHOD OF MANUFACTURING THE SAME

(75) Inventors: Yi-Jiun Li, Taipei Hsien (TW); Peng Liu, Shenzhen (CN); Shi-Wen Zhou, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 140 days.

(21) Appl. No.: 12/252,373

(22) Filed: Oct. 16, 2008

(65) Prior Publication Data

US 2009/0284927 A1 Nov. 19, 2009

(30) Foreign Application Priority Data

May 16, 2008 (CN) .......................... 2008 1 0067259

(51) Int. Cl.
*H05K 7/20* (2006.01)
(52) U.S. Cl. .................. 361/710; 361/704; 361/707; 361/709; 361/717; 361/719; 165/80.3; 165/185; 29/890.3

(58) Field of Classification Search .................. 361/704, 361/707, 710, 717, 719, 709
See application file for complete search history.

(56) References Cited

U.S. PATENT DOCUMENTS

| 6,088,917 | A * | 7/2000 | Lee et al. .................. 29/890.03 |
| 6,230,789 | B1 * | 5/2001 | Pei et al. ..................... 165/80.3 |
| 6,390,182 | B1 * | 5/2002 | Sauer ......................... 165/80.3 |
| 7,330,355 | B2 * | 2/2008 | Kuo et al. .................... 361/707 |
| 2005/0065581 | A1 * | 3/2005 | Fletcher et al. ............. 607/104 |
| 2007/0102142 | A1 * | 5/2007 | Reis et al. ................... 165/80.3 |

* cited by examiner

*Primary Examiner*—Jayprakash N Gandhi
*Assistant Examiner*—Courtney Smith
(74) *Attorney, Agent, or Firm*—Frank R. Niranjan

(57) ABSTRACT

A heat sink includes a base plate and a plurality of cylindrical pins extending upwardly from the base plate. The cylindrical pins each include an upper dissipating portion, a lower mounting portion, and an engaging portion between the dissipating portion and the mounting portion. The mounting portion is interferentially fitted in a lower part of a corresponding aperture of the base plate. The engaging portion has a diameter smaller than that of the mounting portion. The engaging portion is cramped by an interior wall of the base plate defining an upper part of the corresponding aperture of the base plate by punching an upper surface of the base plate downwardly at a rim of the corresponding aperture.

10 Claims, 7 Drawing Sheets

HEAT SINK AND METHOD OF MANUFACTURING THE SAME

BACKGROUND OF THE INVENTION

1. Field of the Invention

The present invention relates to a heat sink, and more particularly to a heat sink which is used to remove heat from an electronic component. The present invention also relates to a method of manufacturing the heat sink.

2. Description of Related Art

With the advance of integrated circuit (IC) technology, CPUs are made more and more compact and have higher operation speed than old ones. Thereby, a great deal of heat is generated by the up-to-date CPUs. However in current trend, it is desired that the electronic devices have a compact size; that is, they are smaller in size than the old ones, and thus, it is required that the heat dissipating devices of the electronic devices are compact accordingly, meanwhile have powerful heat dissipating ability.

Referring to FIGS. 6-7, a conventional heat sink comprises a substrate 3 and a plurality of heat dissipating fins 4. A plurality of recesses 31 is defined in an upper surface of the substrate 3. A straight, cylindrical side wall (not labeled) surrounds a corresponding recess 31. The substrate 3 defines a cone-shaped groove (not labeled) between every two recesses 31. The heat dissipating fins 4 are placed in the recesses 31. A plurality of punching pins 41 then punch into the grooves so that the walls surrounding the recesses 31 expand, and, thus, the heat dissipating fins 4 are cramped in the recesses 31 tightly. Thereby, the assembly of the heat sink is finished.

The above structure has the following disadvantages: the expansions of the walls surrounding the recesses 31 are difficult to control whereby gaps may be generated between the fins 4 and the substrate 3. In other words, an intimate contact between the fins 4 and the substrate 3 is not always guaranteed. In addition, the lower ends of the fins 4 are straight; thus, contact areas between the substrate 3 and the fins 4 are small. The heat which is generated by the CPUs can not be quickly transferred to the whole fins since the gaps and the small contact areas between the fins 4 and the substrate 3.

Therefore, a solution for enhancing the contact areas between the fins and the substrate of the heat sink and making sure that the fins are securely fastened to the substrate is needed.

SUMMARY OF THE INVENTION

A heat sink includes a base plate and a plurality of cylindrical pins extending upwardly from the base plate. The cylindrical pins each include an upper dissipating portion, a lower mounting portion, and an engaging portion between the dissipating portion and the mounting portion. The mounting portion is interferentially fitted in a lower part of a corresponding aperture of the base plate. The engaging portion has a diameter smaller than that of the mounting portion, which in turn is smaller than that of the dissipating portion. The engaging portion is cramped by an interior wall of the base plate defining an upper part of the corresponding aperture of the base plate due to a deformation of the base plate obtained by punching an upper surface of the base plate at a rim of the corresponding aperture downwardly into the base plate.

Other advantages and novel features of the present invention will become more apparent from the following detailed description when taken in conjunction with the accompanying drawings.

BRIEF DESCRIPTION OF THE DRAWINGS

Many aspects of the present heat sink can be better understood with reference to the following drawings. The components in the drawings are not necessarily drawn to scale, the emphasis instead being placed upon clearly illustrating the principles of the present heat sink. Moreover, in the drawings, like reference numerals designate corresponding parts throughout the several views.

DETAILED DESCRIPTION OF THE INVENTION

Figure 1:
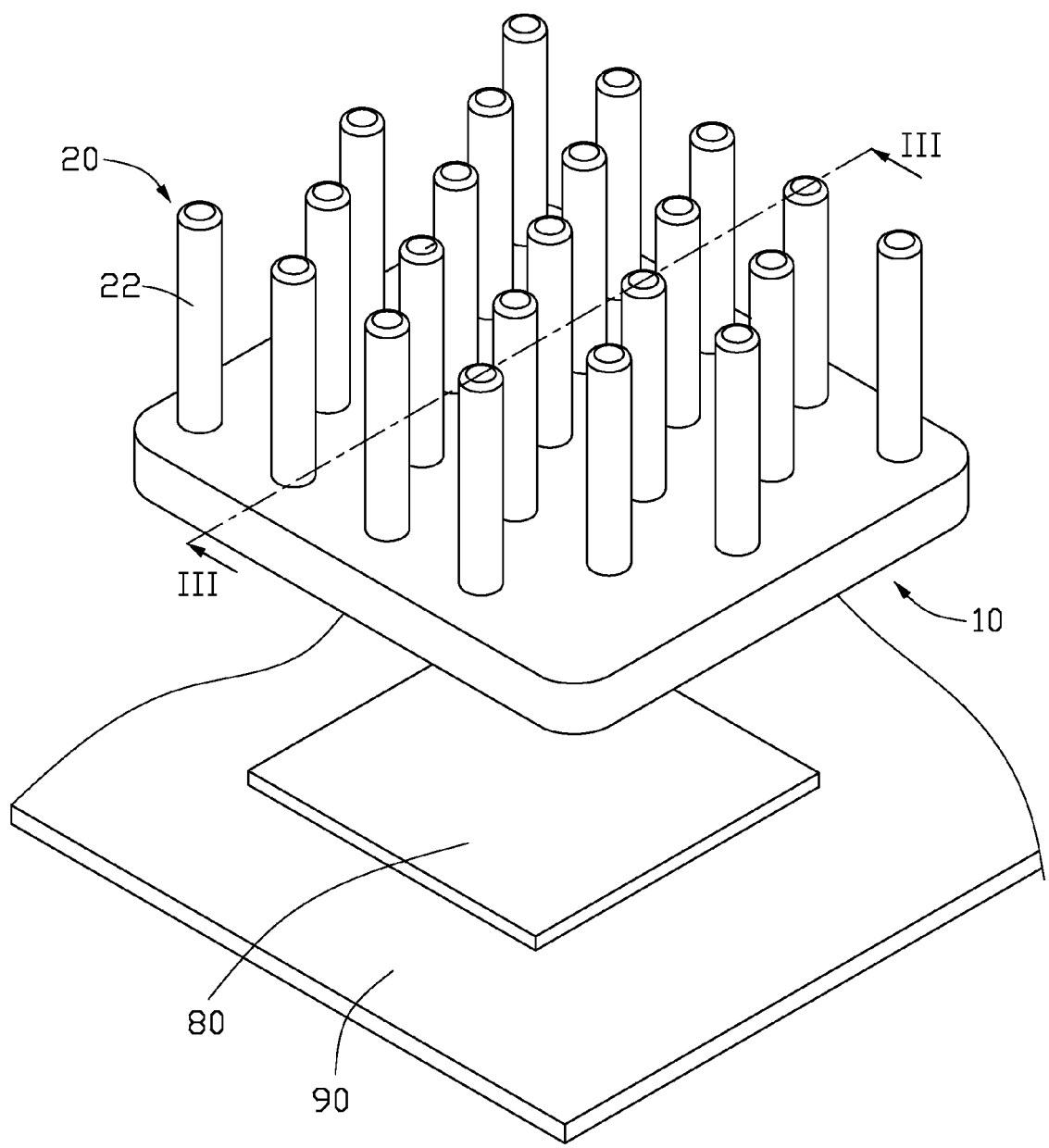
FIG. 1 is an isometric view of a heat sink in accordance with a preferred embodiment of the present invention, together a printed circuit board and an electronic component mounted on the printed circuit board.
Figure 2:
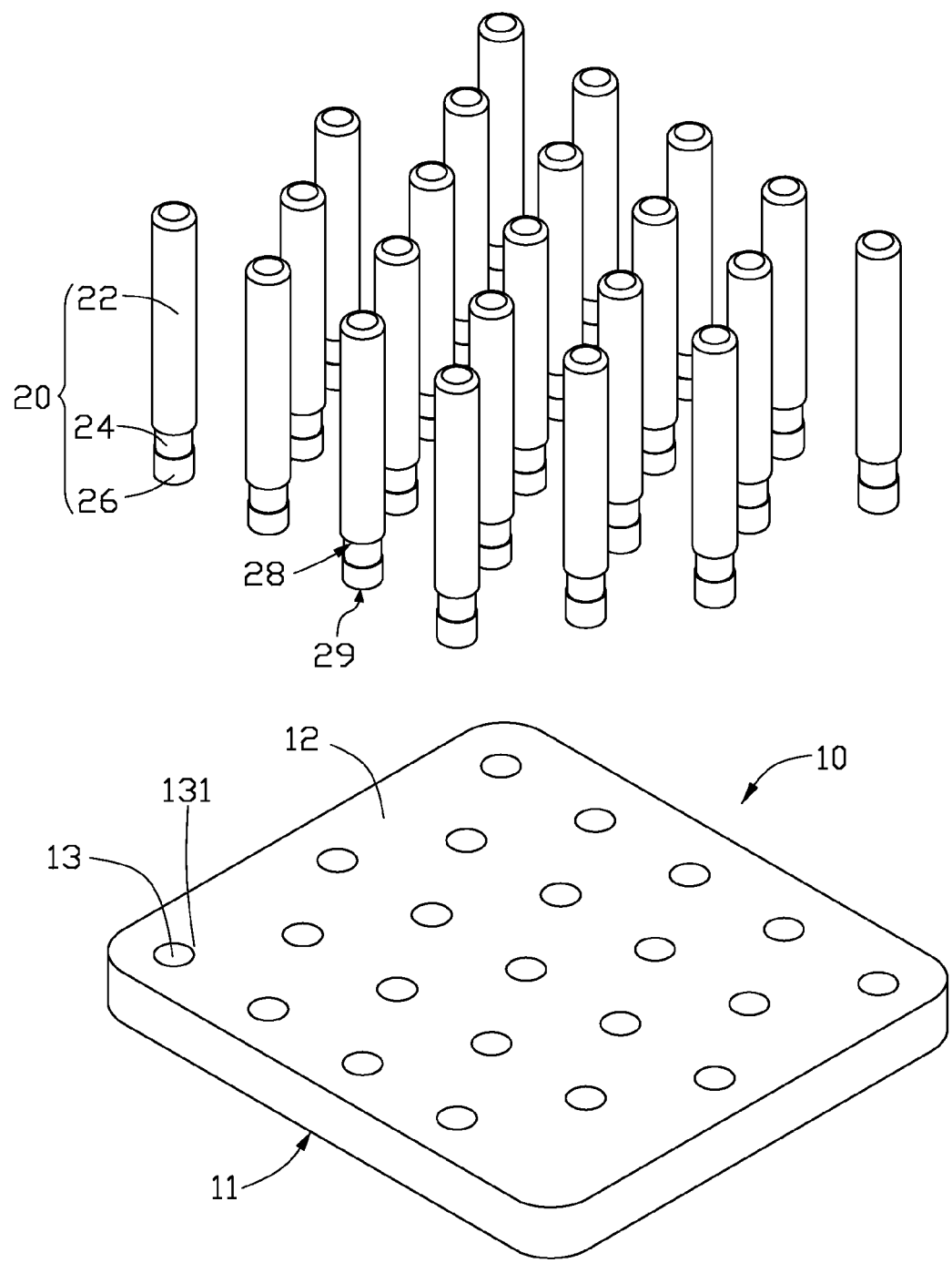
FIG. 2 is an exploded view of the heat sink of FIG. 1.

Referring to FIGS. 1-2, a heat sink in accordance with a preferred embodiment of the present invention is used for dissipating heat generated by an electronic device 80 located on a printed circuit board 90. The heat sink comprises a base plate 10 and a plurality of cylindrical pins 20 extending upwardly from the base plate 10.

The base plate 10 has a flat bottom surface 11 for attaching to the electronic device 80 and an upper surface 12 opposite to the bottom surface 11. The base plate 10 defines an array of apertures 13 extending through the upper surface 12 and the bottom surface 11 thereof.

Each cylindrical pin 20 has a circular cross section. Each cylindrical pin 20 comprises an upper dissipating portion 22, a lower mounting portion 26, and an engaging portion 24 between the dissipating portion 22 and the mounting portion 26. The dissipation portion 22, the mounting portion 26 and the engaging portion 24 have a common axis. A diameter of the mounting portion 26 of each cylindrical pin 20 is slightly larger than a bore diameter of each aperture 13 so that the mounting portion 26 can be interferentially fitted in the aperture 13 when the cylindrical pin 20 and base plate 10 are assembled together. A diameter of the engaging portion 24 is smaller than the bore diameter of the aperture 13, and a diameter of the dissipating portion 22 is larger than the bore diameter of the aperture 13. The diameter of the engaging portion 24 of each cylindrical pin 20 is smaller than that of the mounting portion 26, and the diameter of the mounting portion 26 is smaller than that of the dissipating portion 22. The dissipating portion 22 has an annular bottom 28 with a stepped configuration. A total length of the mounting portion 26 and the engaging portion 24 along the axis of the cylindrical pin 20 is generally equal to a length of each aperture 13 in the base plate 10. In other words, the total length of the mounting portion 26 and the engaging portion 24 is equal to a thickness of the base plate 10. Each mounting portion 26 has a flat bottom surface 29.

Figure 3:
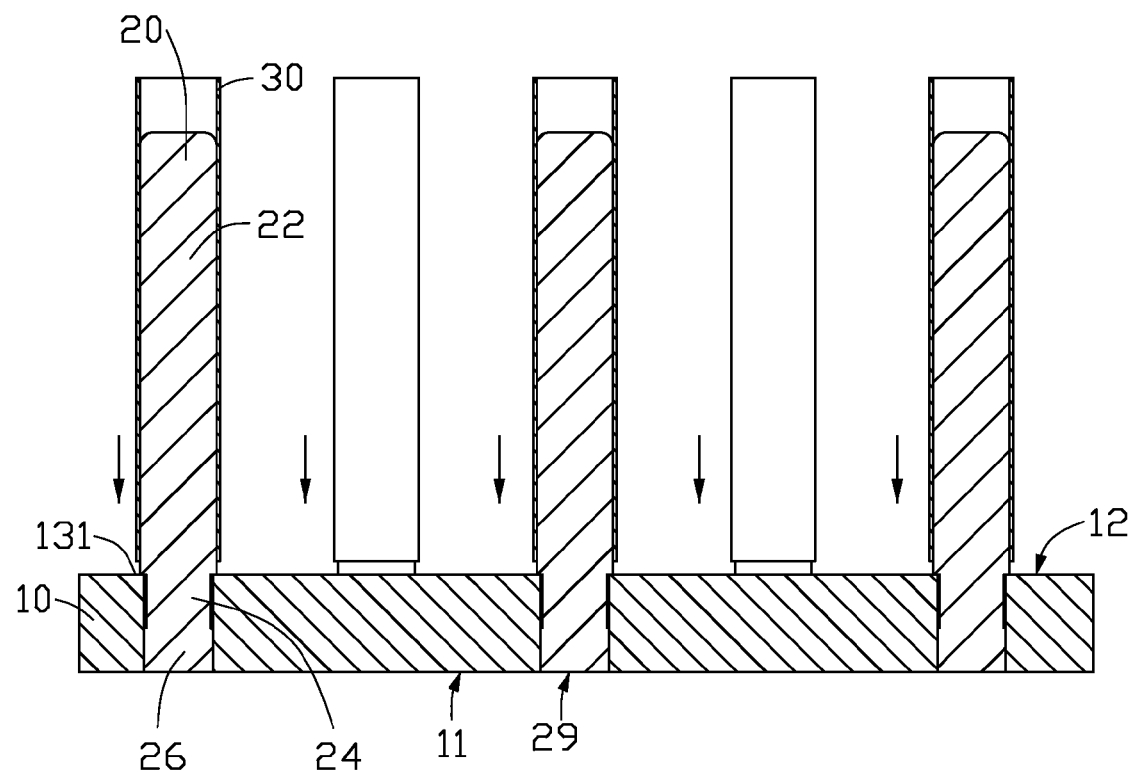
FIG. 3 is a cross-sectional view of the heat sink of FIG. 1 taken along line III-III thereof, with a plurality of punching tubes sleeving cylindrical pines of the heat sink respectively.
Figure 4:
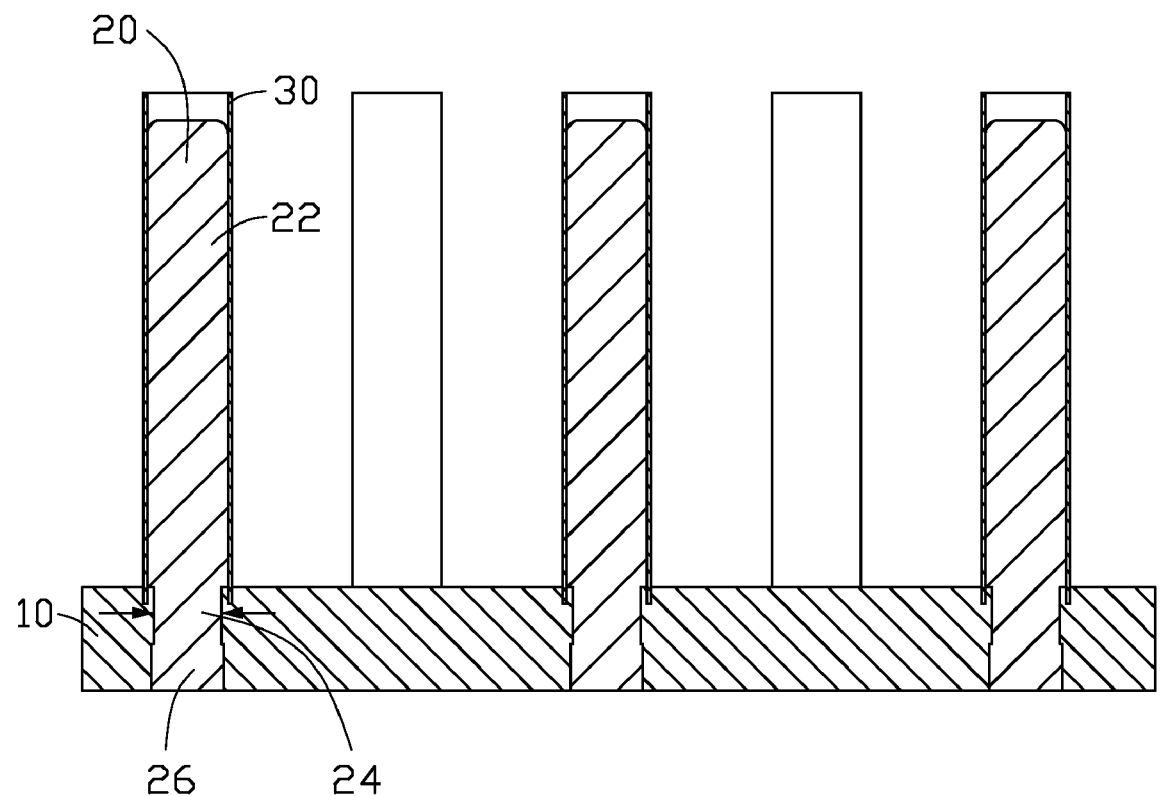
FIG. 4 is a view similar to FIG. 3, with the punching tubes being punched downwardly into the base plate.
Figure 5:
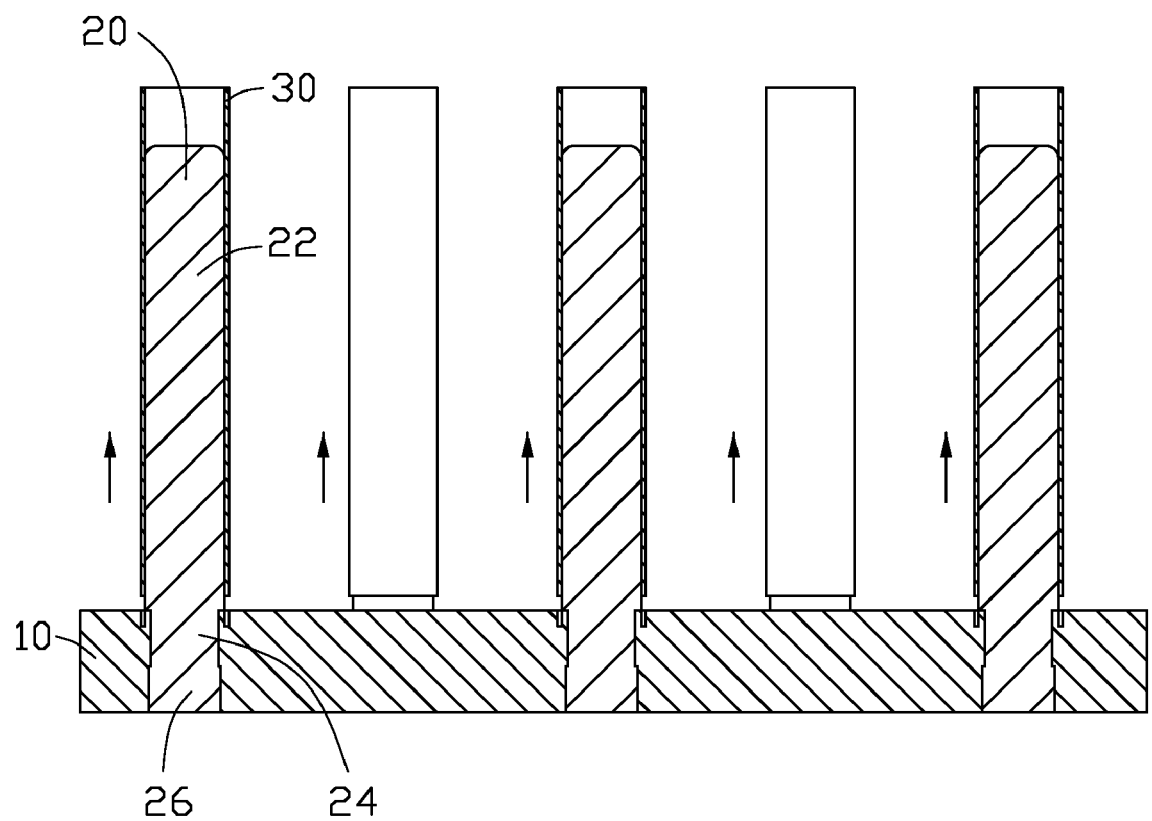
FIG. 5 is a view similar to FIG. 4, with the punching tubes being pulled upwardly away from the base plate after the punching.
Figure 6:
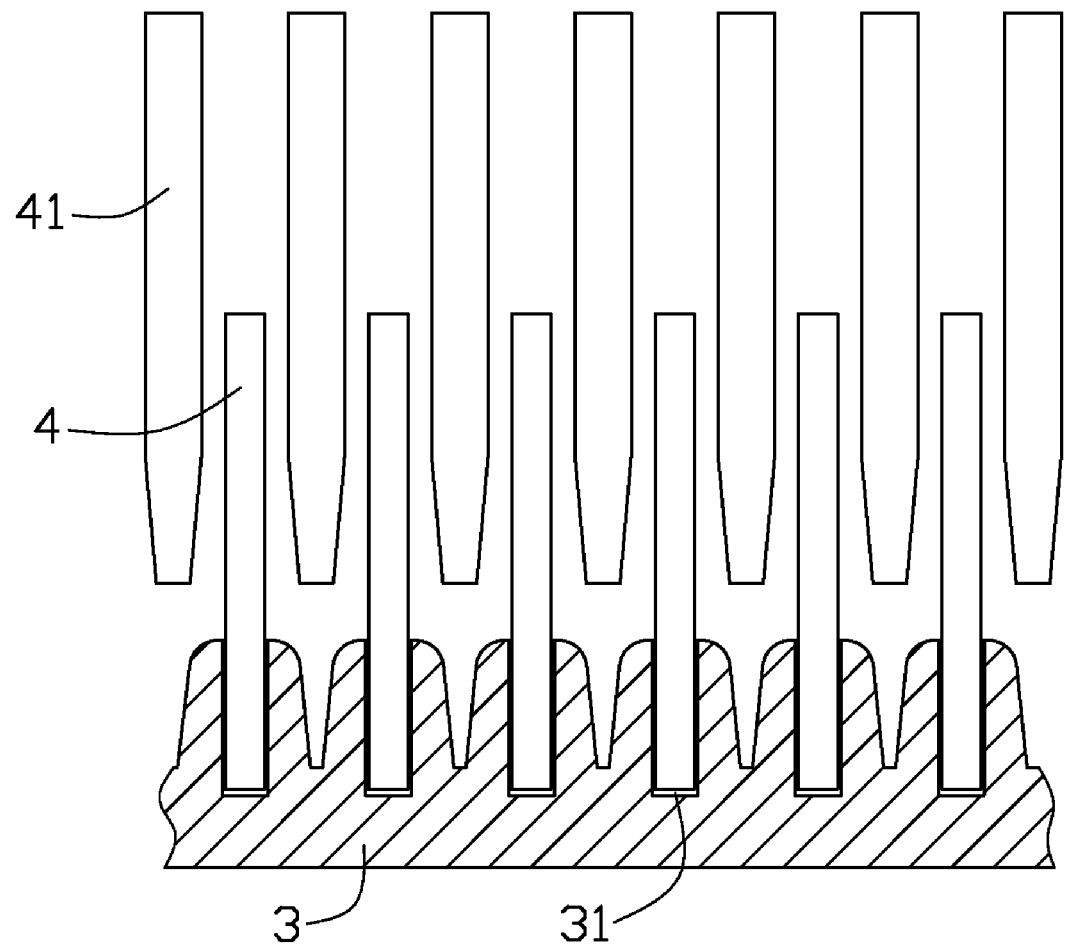
FIG. 6 is a schematic, cross-sectional view of a heat sink in accordance with a related art before a plurality of punching pins punch into grooves of the heat sink.
Figure 7:
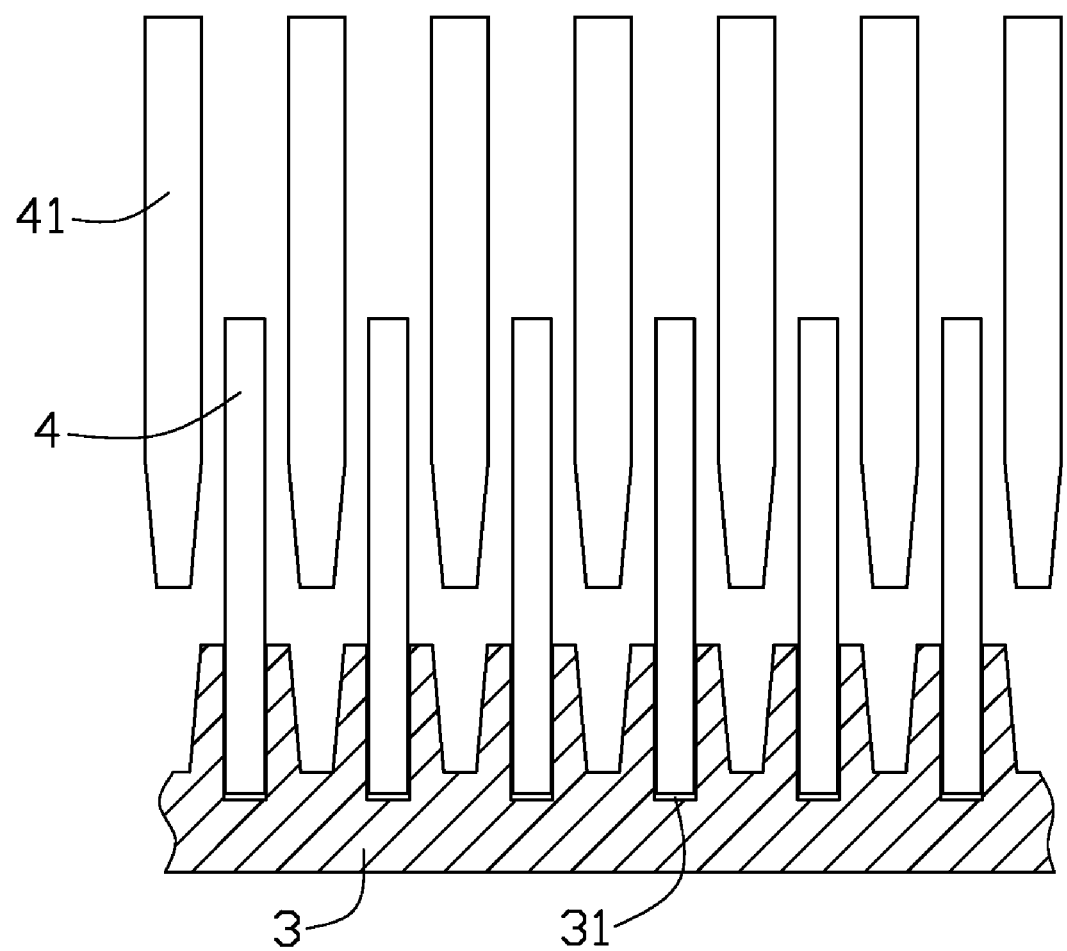
FIG. 7 is a view similar to FIG. 6, showing that the punching pins had punched into the grooves and the grooves are expanded.

Referring to FIGS. 3-5, in assembly, the mounting portions 26 of the cylindrical pins 20 are pressed downwardly and inserted into the apertures 13 until the bottom surfaces 29 of the mounting portions 26 are coplanar with the bottom surface 11 of the base plate 10, wherein the mounting portions 26 are interferentially fitted into the apertures 13 of the base plate 10. Exterior faces of the mounting portions 26 securely engage with interior walls of the base plate 10 defining lower parts of the apertures 13 and have an intimate contact therewith. A small annular gap (not labeled) is defined between an exterior face of the engaging portion 24 of each cylindrical pin 20 and the interior wall of the base plate 10 defining an upper part of the aperture 13. The dissipating portion 22 of each cylindrical pin 20 is extended upwardly beyond the upper surface 12 of the base plate 10. In this embodiment, the annular bottom 28 of each dissipating portion 22 abuts against the upper surface 12 of the base plate 10 at a periphery (not labeled) of each aperture 13.

After the cylindrical pins 20 are received into the apertures 13, a plurality of punching tubes 30 are brought to sleeve the cylindrical pins 20, respectively. Each punching tube 30 has a bottom end abutting against the upper surface 12 of the base plate 10 at a rim 131 of the aperture 13. The rim 131 surrounds the periphery of the aperture 13. Then the punching tubes 30 are forced to punch the rims 131 downwardly until the bottom ends of the punching tubes 30 are embedded downwardly a distance into the upper surface 12 of the base plate 10. Thus, the interior walls of the base plate 10 defining the upper parts of the apertures 13 are pressed sideward by the bottom ends of the punching tubes 30 and have a sideward plastic deformation toward the engaging portions 24 of the cylindrical pins 20. Accordingly, the engaging portions 24 are cramped by the interior walls of the base plate 10 defining the upper parts of the apertures 13. The base plate 10 simultaneously engage with the mounting portions 26 and the engaging portions 24 of the cylindrical pins 20. Therefore, the cylindrical pins 20 are tightly secured in the apertures 13 and the heat sink is formed.

The engaging portion 24 and the mounting portion 26 of each cylindrical pin 20 are cramped by the interior wall of base plate 10 defining the aperture 13, and the diameter of the engaging portion 24 is smaller than the diameter of the lower mounting portion 26, so that the cylindrical pins 20 are fixedly engaged in the apertures 13 and cannot have an upward movement relative to the base plate 10. Furthermore, the bottom surfaces 29 of the mounting portions 26 of the cylindrical pins 20 are coplanar with the bottom surface 11 of the base plate 10 to directly contact the electronic device 80, so that a part of heat generated by the electronic device 80 is directly absorbed by the mounting portions 26 and then transferred to the dissipating portions 22 of the cylindrical pins 20 to be dissipated to surrounding air.

A method of manufacturing the heat sink comprises the steps of:

a) forming a plurality of apertures 13 in a base plate 10, the apertures 13 extending through an upper surface 12 and a bottom surface 11 of the base plate 10;

b) offering a plurality of cylindrical pins 20 each comprising an upper dissipating portion 22, a lower mounting portion 26, and an engaging portion 24 between the dissipating portion 22 and the mounting portion 26, wherein a diameter of the mounting portion 26 is slightly larger than a bore diameter of each aperture 13, a diameter of the engaging portion 24 is smaller than the bore diameter of the aperture 13 and a diameter of the dissipating portion 22 is larger than the bore diameter of the aperture 13; a sum of a length of the mounting portion 26 and a length of the engaging portion 24 is equal to a thickness of the base plate 10;

c) inserting the mounting portions 26 and engaging portions 24 of the cylindrical pins 20 in the apertures 13 of the base plate 10 from the upper surface 12 of the base plate 10 until bottom surfaces 29 of the mounting portions 26 are coplanar with the bottom surface 11 of the base plate 10, wherein the mounting portions 26 are interferentially fitted into lower parts of the apertures 13 of the base plate 10, and a gap is defined between an exterior face of each of the engaging portions 24 and an interior wall of the base plate 10 defining an upper part of each of the apertures 13; and d) punching the upper surface 12 of the base plate 10 at rims 131 of the apertures 13 of the base plate 10 downwardly to make the base plate 10 have a plastic deformation with a degree that the interior walls of the base plate 10 defining the upper parts of the apertures 13 are pressed sideward to cramp the engaging portions 24 of the cylindrical pins 20.

Since the mounting portions 26 of the cylindrical pins 20 are interferentially fitted in corresponding apertures 13 before the base plate 10 is punched, the cylindrical pins 20 are not easy to escape from the apertures 13 and can be securely positioned during the punching. Thus, the punching process can be easily carried out.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink comprising:
   a single monolithic base plate having a plurality of apertures extending through an upper surface and a bottom surface thereof, the bottom surface being adapted for absorbing heat from a heat-generating component; and
   a plurality of cylindrical pins respectively received in the apertures of the base, the cylindrical pins being adapted for dissipating heat of the base plate to surrounding air, each of the cylindrical pins comprising an upper dissipating portion, a lower mounting portion, and an engaging portion between the dissipating portion and the mounting portion, a diameter of the dissipating portion being larger than a diameter of the mounting portion, the mounting portion being interferentially fitted in a lower part of a corresponding aperture which is adjacent to the bottom surface of the base plate, the engaging portion having a diameter smaller than that of the mounting portion, and the engaging portion being cramped by an interior wall of the base plate defining an upper part of the corresponding aperture which is adjacent to the upper surface of the base plate;
   wherein each cylindrical pin is elongated, a sum of a length of the mounting portion and a length of the engaging portion is equal to a thickness of the base plate, and a length of the dissipating portion exceeds the thickness of the base plate, the mounting portion being entirely received in the lower part of a corresponding aperture, the engaging portion being entirely received in the upper part of the corresponding aperture, and the dissipating portion protruding out from the base plate entirely.

2. The heat sink as described in claim 1, wherein a bottom surface of the mounting portion of each cylindrical pin is coplanar with the bottom surface of the base plate.

3. The heat sink as described in claim 1, wherein each dissipating portion has an annular bottom abutting against the upper surface of the base plate.

4. A method of manufacturing a heat sink comprising steps of:
   a) forming a plurality of apertures in an upper surface of a base plate;
   b) offering a plurality of cylindrical pins each comprising an upper dissipating portion, a lower mounting portion, and an engaging portion between the dissipating portion and the mounting portion, a diameter of the mounting portion being slightly larger than a bore diameter of each aperture, a diameter of the dissipating portion being larger than the diameter of the mounting portion, and a diameter of the engaging portion being smaller than the bore diameter of each aperture;
   c) inserting the mounting portion and engaging portion of each cylindrical pin into a corresponding aperture of the base plate, the mounting portion being interferentially fitted into a lower part of the corresponding aperture of the base plate, and the engaging portion being separated apart from an interior wall of the base plate defining an upper part of the corresponding aperture; and
   d) punching the upper surface of the base plate at a rim of the corresponding aperture of the base plate to cause the base plate to have a plastic deformation whereby the interior wall of the base plate defining the upper part of the corresponding aperture cramps the engaging portion of the each cylindrical pin.

5. The method as described in claim 4, wherein the apertures also extend through a bottom surface of the base plate.

6. The method as described in claim 5, wherein a bottom surface of the mounting portion of the each cylindrical pin is coplanar with the bottom surface of the base plate.

7. The method as described in claim 4, wherein the dissipating portion has an annular bottom abutting against the upper surface of the base plate.

8. The heat sink as described in claim 3, wherein the base plate defines a plurality of annular grooves corresponding to the plurality of cylindrical pins, the annular grooves being concave within the upper surface of the base plate, each groove encircling the mounting portion of one corresponding cylindrical pin.

9. The heat sink as described in claim 8, wherein the annular groove has a depth less than that of the upper part of the aperture, and an outer diameter exceeding the diameter of the dissipating portion of the cylindrical pin.

10. The heat sink as described in claim 9, wherein an inner diameter of the annular groove is substantially equal to the diameter of the dissipating portion of the cylindrical pin.

\* \* \* \* \*